(12) United States Patent
Sreenivasan

(10) Patent No.: US 8,012,394 B2
(45) Date of Patent: Sep. 6, 2011

(54) TEMPLATE PATTERN DENSITY DOUBLING

(75) Inventor: Sidlgata V. Sreenivasan, Austin, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/344,100

(22) Filed: Dec. 24, 2008

(65) Prior Publication Data

US 2009/0166933 A1    Jul. 2, 2009

Related U.S. Application Data

(60) Provisional application No. 61/017,412, filed on Dec. 28, 2007.

(51) Int. Cl.
    *B28B 11/08*    (2006.01)
(52) U.S. Cl. ............. 264/293; 425/385; 216/44; 216/52
(58) Field of Classification Search .................. 264/293; 425/385; 216/44, 52
    See application file for complete search history.

(56) References Cited

U.S. PATENT DOCUMENTS

| | | | |
|---|---|---|---|
| 5,972,570 A * | 10/1999 | Bruce et al. .................... 430/314 |
| 6,087,052 A * | 7/2000 | Manabe et al. ................ 430/30 |
| 6,696,220 B2 | 2/2004 | Bailey et al. | |
| 6,900,881 B2 | 5/2005 | Sreenivasan et al. | |
| 6,916,584 B2 | 7/2005 | Sreenivasan et al. | |
| 6,919,152 B2 | 7/2005 | Sreenivasan et al. | |
| 6,936,194 B2 | 8/2005 | Watts | |
| 6,986,975 B2 | 1/2006 | Sreenivasan et al. | |
| 7,027,156 B2 | 4/2006 | Watts et al. | |
| 7,037,639 B2 | 5/2006 | Voisin | |
| 7,070,405 B2 | 7/2006 | Sreenivasan et al. | |
| 7,077,992 B2 | 7/2006 | Sreenivasan et al. | |
| 7,136,150 B2 | 11/2006 | Sreenivasan et al. | |
| 7,140,861 B2 | 11/2006 | Watts et al. | |
| 7,205,078 B2 * | 4/2007 | Osawa et al. .................... 430/30 |
| 7,229,273 B2 | 6/2007 | Bailey et al. | |
| 7,279,113 B2 | 10/2007 | Watts et al. | |
| 7,281,921 B2 | 10/2007 | Watts et al. | |
| 7,309,225 B2 | 12/2007 | McMackin et al. | |
| 7,491,637 B2 | 2/2009 | Sreenivasan et al. | |
| 2002/0058187 A1 * | 5/2002 | Usui et al. ......................... 430/5 |
| 2004/0021866 A1 * | 2/2004 | Watts et al. .................... 356/401 |
| 2004/0065976 A1 | 4/2004 | Sreenivasan et al. | |
| 2005/0064344 A1 | 3/2005 | Bailey et al. | |
| 2005/0084804 A1 | 4/2005 | Truskett et al. | |
| 2005/0189676 A1 | 9/2005 | Sreenivasan | |
| 2005/0202350 A1 * | 9/2005 | Colburn et al. ................ 430/320 |
| 2005/0230767 A1 * | 10/2005 | Park et al. ..................... 257/414 |
| 2005/0230882 A1 | 10/2005 | Watts et al. | |
| 2005/0238965 A1 | 10/2005 | Tyrrell | |
| 2006/0019183 A1 | 1/2006 | Voisin | |
| 2006/0063277 A1 * | 3/2006 | Vidusek et al. .................... 438/2 |
| 2006/0113697 A1 | 6/2006 | Sreenivasan | |

(Continued)

OTHER PUBLICATIONS

Sigma-Aldrich MSDS for product No. 392103 May 30, 2008.*

*Primary Examiner* — Joseph S Del Sole
*Assistant Examiner* — David N Brown, II
(74) *Attorney, Agent, or Firm* — Cameron A. King

(57) ABSTRACT

A sub-master template is patterned to provide at least double the density of features of a master template. The sub-master template and master template may employ the use of alignment marks during the patterning process.

10 Claims, 10 Drawing Sheets

U.S. PATENT DOCUMENTS

| | | |
|---|---|---|
| 2006/0266916 A1 | 11/2006 | Miller et al. |
| 2007/0122942 A1 | 5/2007 | Sreenivasan et al. |
| 2007/0228610 A1 | 10/2007 | Sreenivasan et al. |
| 2007/0231981 A1 | 10/2007 | Sreenivasan et al. |
| 2007/0247608 A1 | 10/2007 | Sreenivasan et al. |
| 2008/0095878 A1 | 4/2008 | Bailey et al. |

* cited by examiner

TEMPLATE PATTERN DENSITY DOUBLING

CROSS REFERENCE TO RELATED APPLICATION

This application claims priority to U.S. Provisional Patent Application Ser. No. 61/017,412 filed on Dec. 28, 2007, which is hereby incorporated by reference herein.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference herein.

An imprint lithography technique disclosed in each of the aforementioned U.S. patent publications and patent includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
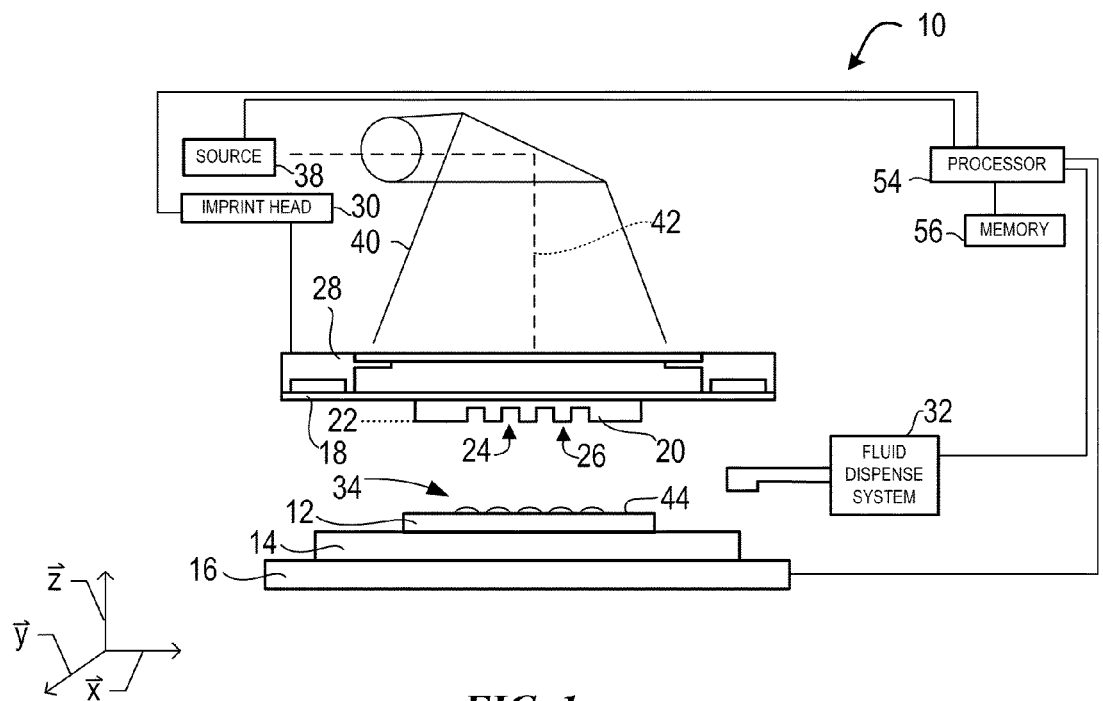
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide motion along the x, y, and z axes. Stage 16, substrate 12, and substrate chuck 14 may also be positioned on a base (not shown).

Spaced-apart from substrate 12 is template 18. Template 18 may include mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, both of which are hereby incorporated by reference herein.

Figure 2:
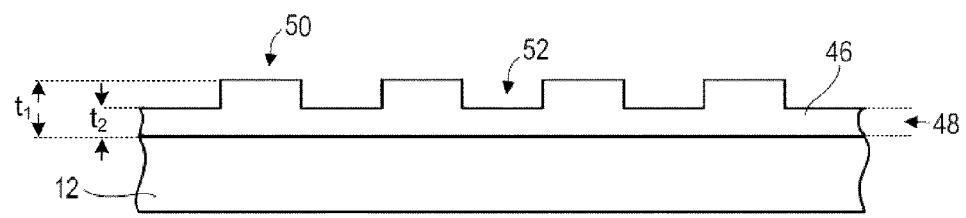
FIG. 2 illustrates a simplified side view of the substrate shown in FIG. 1 having a patterned layer positioned thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference herein.

Figure 3:
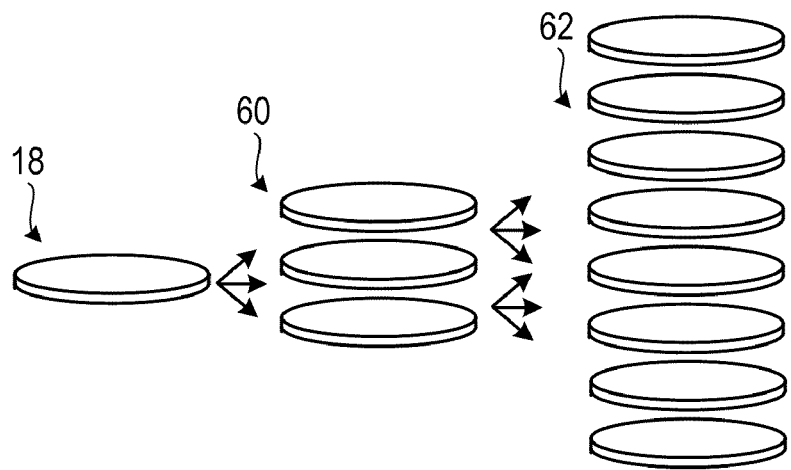
FIG. 3 illustrates a flow diagram for supplying such replications.

As template 18 may be expensive to manufacture, replications of a template 18 may aid in reducing manufacturing costs. FIG. 3 illustrates a flow diagram for supplying such replications. Generally, template 18, hereinafter referred to as master template 18, may be replicated to form a plurality of sub-master templates 60. These sub-master templates 60 may then form working templates 62 and/or patterned wafers for device fabrication. The device wafers may be patterned as a whole substrate or in a step and repeat manner described in further detail in S. V. Sreenivasan, "Nano-Scale Manufacturing Enabled by Imprint Lithography," *MRS Bulletin, Special Issue on Nanostructured Materials in Information Storage*, Vol. 33, September 2008, pp. 854-863, which is hereby incorporated by reference herein.

Figure 19:
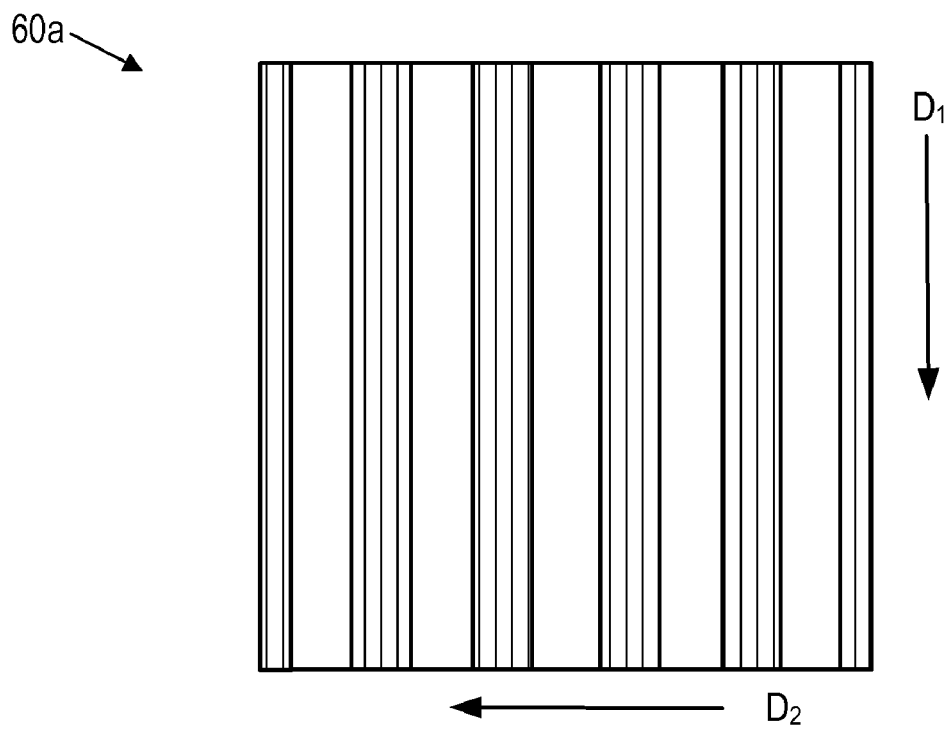
FIGS. 19 and 20 illustrate formation of an exemplary sub-master template using pattern density doubling in two directions.
Figure 20:
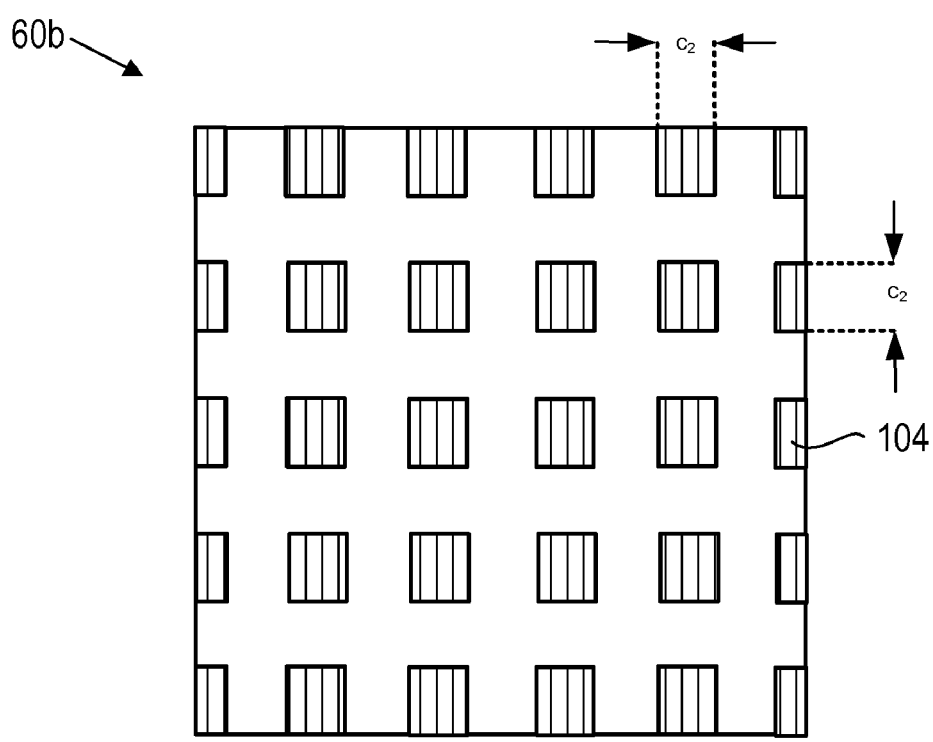

Features of master template 18 may be altered in transferring patterns from master template 18 to sub-master template 60 and/or sub-master template 60 to working template 62 and/or patterned wafers. For example, the resolution and/or density of features formed by master template 18 may be increased or reduced. FIGS. 4-9 illustrate formation of sub-master template 60 having substantially similar features to master template 18. FIGS. 10-15 further illustrate formation using pattern density doubling in one direction to provide sub-master template 60a having a double the density of features of master template 18. FIGS. 19 and 20 illustrate formation of sub-master template 60b from master template 18 that alters features using pattern density doubling in two directions. It should be noted that the use of pattern density doubling is not limited herein to the formation of sub-master templates 60-60b, and may be used to increase resolution and/or control dimension of line and space features of any substrate 12. Additionally, for simplicity, reverse tone formation is described in exemplary formations, however, it should be apparent to one skilled in the art other techniques may be used.

FIGS. 4-9 illustrate simplified side views of exemplary formation of sub-master template 60 from master template 18.

Figure 4:
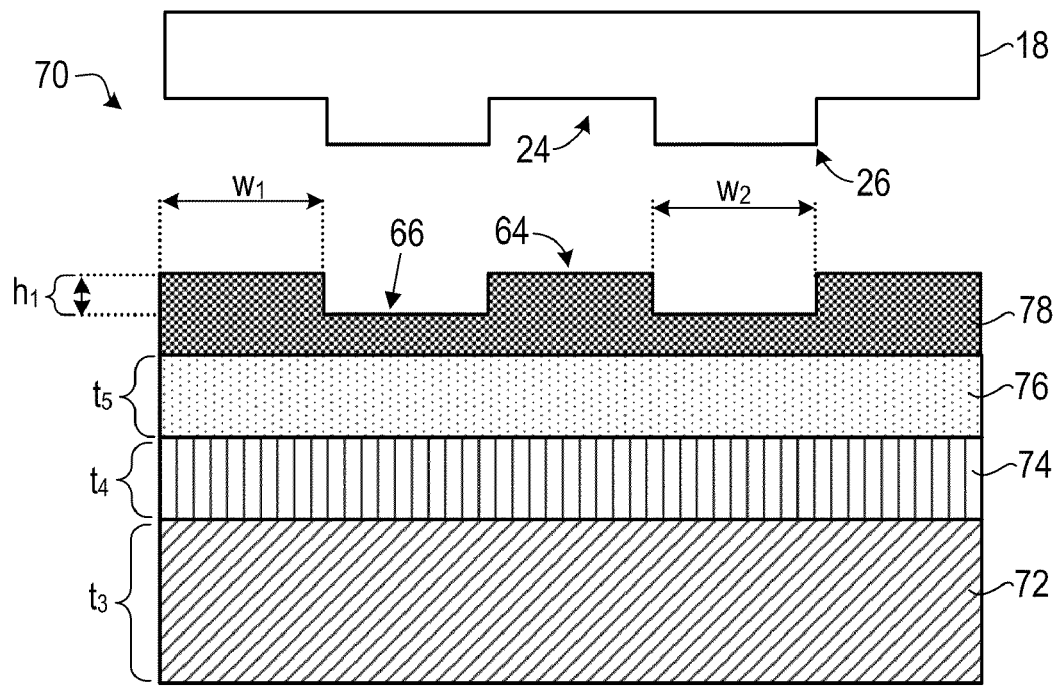
FIGS. 4-9 illustrate simplified side views of exemplary formation of sub-master template.

Referring to FIG. 4, master template 18 may form a relief pattern on a multi-layer substrate 70. Multi-layer substrate 70 may comprise a substrate layer 72, an etch mask layer 74, an adhesion layer 76, and/or a resist layer 78. Generally, etch mask layer 74 may be positioned between substrate layer 72 and adhesion layer 76. Adhesion layer 76 may be positioned between etch mask layer 74 and resist layer 78.

Substrate layer 72 may be formed of materials including, but not limited to, silicon, gallium arsenide, quartz, fused-silica, sapphire, organic polymers, siloxane polymers, borosilicate glass, fluorocarbon polymers, and/or the like. Substrate layer 72 may have a thickness $t_3$. For example, thickness $t_3$ of substrate layer 72 may be approximately 0.1 mm to 10 mm.

Etch mask layer 74 may be formed of materials including, but not limited to, chrome, $SiO_2$, SiN, polysilicon, and/or the like. Etch mask layer 74 may have a thickness $t_4$. For example, etch mask layer 74 may have a thickness $t_4$ of approximately 5-50 nm.

Adhesion layer 76 may be formed of adhesion materials as further described in U.S. Publication No. 2007/0212494, U.S. Publication No. 2007/0017631, and U.S. Publication No. 2007/0021520, all of which are hereby incorporated by reference herein. Adhesion layer 76 may have a thickness $t_5$. For example, adhesion layer 76 may have a thickness $t_5$ of approximately 1-100 nm.

Resist layer 78 may be a silicon-containing low-k layer, a BCB layer, or the like. Additionally, resist layer 78 may be an anti-reflective coating (BARC) layer. For example, resist layer 78 may be formed of DUV30J-6, manufactured by Brewer Science, Inc. having an office located in Rolla, Mo. Alternatively, resist layer 78 may be a silicon-free layer. For example, resist layer 78 may consist of the following:

Composition 1 isobornyl acrylate
n-hexyl acrylate
ethylene glycol diacrylate
2-hydroxy-2-methyl-l-phenyll-propan-l-one In one example of COMPOSITION 1, isobornyl acrylate may comprise approximately 55% of the composition, n-hexyl acrylate may comprise approximately 27% of the composition, ethylene glycol diacrylate may comprise approximately 15% of the composition, and 2-hydroxy-2-methyl-l-phenyl-propan-l-one may comprise approximately 3% of the composition. One example of the compound 2-hydroxy-2-methyl-l-phenyl-propan-l-one is the initiator DAROCUR® 1173 manufactured by CIBA® having an office located in Tarrytown, N.Y. COMPOSITION 1 also includes stabilizers that are well known in the chemical art. Stabilizers generally increase the operational life of the composition.

Resist layer 78 may include one or more protrusions 64 and/or recessions 66. Protrusions 64 in resist layer 78 may have a width $w_1$. For example, protrusions 64 in resist layer 78 may have a width $w_1$ of approximately 40 nm. Multiple protrusions 64 in resist layer 78 may have a substantially similar width $w_1$, different width $w_1$, or a combination thereof. Protrusions 64 in resist layer 78 may have a height $h_1$. For example, protrusions 64 may have a height $h_1$ of approximately 1 to 4 times the width $w_1$.

Recessions 66 in resist layer 78 may have a width $w_2$ associated therewith. For example, recessions 66 in resist layer 78 may have a width $w_2$ of approximately 40 nm. Multiple recessions 66 in resist layer 78 may have a substantially similar width $w_2$, different width $w_2$, or a combination thereof. The width $w_1$ of protrusion 66 may be substantially similar, different, or a combination thereof to width $w_2$ of recession 64.

Protrusions 64 and recessions 66 may be formed by techniques including, but not limited to, imprint lithography, e-beam lithography, photolithography (various wavelengths including 193 nm, 157 nm, and 13.2-13.4 nm), x-ray lithography, ion-beam lithography, and atomic beam lithography. For example, protrusions 64 and recessions 66 may be formed by imprint lithography as further described in U.S. Pat. No. 6,932,934, U.S. Patent Publication No. 2004/0124566, U.S. Patent Publication No. 2004/0188381, U.S. Patent Publication No. 2004/0211722, all of which are hereby incorporated by reference herein.

Figure 5:
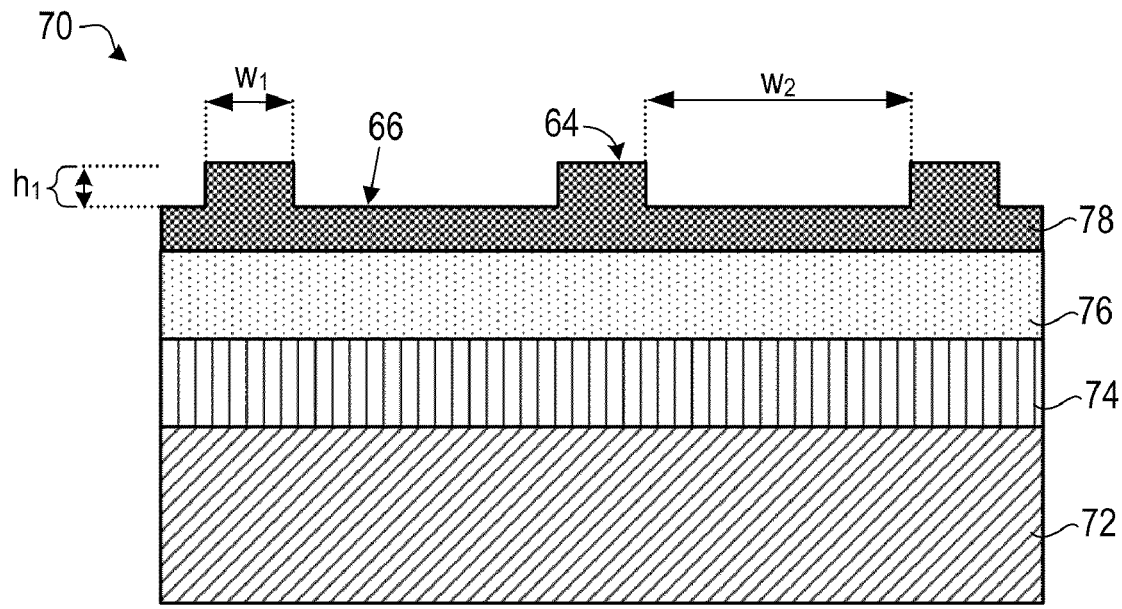

Referring to FIGS. 4 and 5, multi-layer substrate 70 may be etched to alter width $w_1$ of protrusions 64 and/or width $w_2$ of recessions 66. For example, multi-layer substrate 70 may be etched to reduce width $w_1$ of protrusions 64 in resist layer 78. By reducing width $w_1$ of protrusions 64 in resist layer 78, width $w_2$ of recessions 66 in resist layer 78 may be increased. For example, by reducing width $w_1$ of protrusions 64 to approximately 20 nm, width $w_2$ of recession 66 may increase to 60 nm.

Multi-layer substrate 70 may be etched using, for example, a trim etching process. Exemplary trim etching processes are further described in U.S. Pat. No. 7,186,656, which is hereby incorporated by reference herein.

Figure 6:
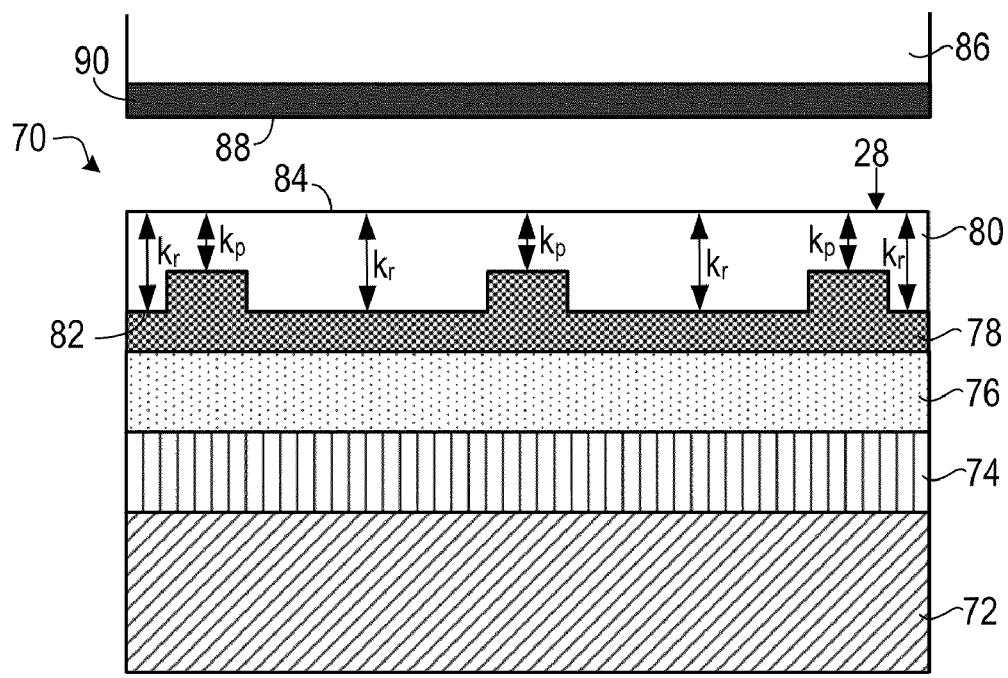
Figure 7:
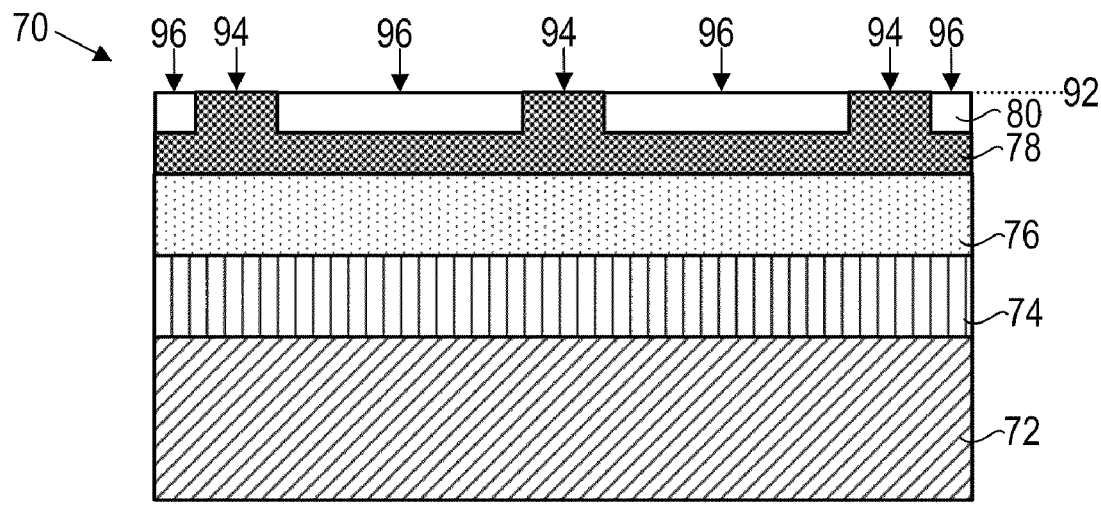
Figure 8:
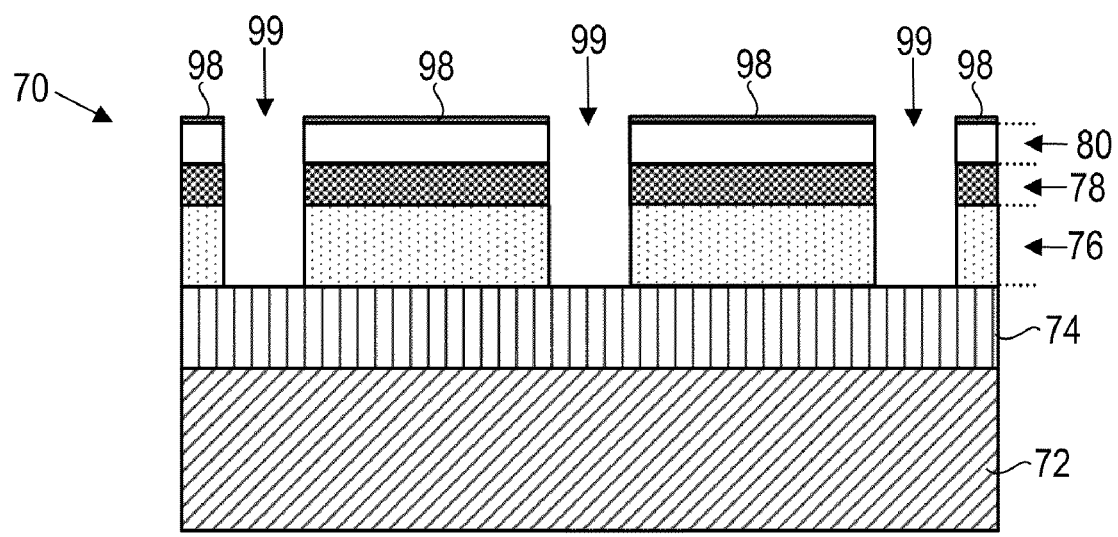

Referring to FIGS. 6-8, a reverse tone of protrusions 64 may be transferred within multi-layer substrate 70. As illustrated in FIG. 6, a conformal layer 80 may be deposited over protrusions 64 and recessions 66. Conformal layer 80 may be deposited by techniques including, but not limited to, contact planarization, spin-on techniques, and the like.

Conformal layer 80 may be formed of a polymerizable material. Exemplary compositions from which to form conformal layer 80 may include:

Composition 2 hydroxyl-functional polysiloxane
hexamethoxymethylmelamine
toluenesulfonic acid
methyl amyl ketone Composition 3 hydroxyl-functional polysiloxane
hexamethoxymethylmelamine
gamma-glycidoxypropyltrimethoxysilane
toluenesulfonic acid
methyl amyl ketone In one example of COMPOSITION 2, hydroxyl-functional polysiloxane may comprise approximately 4% of the composition, hexamethoxymethylmelamine may comprise approximately 0.95% of the composition, toluenesulfonic acid may comprise approximately 0.05% of the composition and methyl amyl ketone may comprise approximately 95% of the composition.

In one example of COMPOSITION 3, hydroxyl-functional polysiloxane may comprise approximately 4% of the composition, hexamethoxymethylmelamine may comprise approximately 0.7% of the composition, glycidoxypropyltrimethoxysilane may comprise approximately 0.25% of the composition, toluenesulfonic acid may comprise approximately 0.05% of the composition, and methyl amyl ketone may comprise approximately 95% of the composition.

Conformal layer 80 may have a first side 82 adjacent to resist layer 78 and an opposing second side 84 distant to resist layer 78. Second side 84 may provide a normalization surface. For example, the normalization surface may provide a substantially normalized profile. For example, the normalization surface may provide a substantially normalized profile by ensuring distances $k_p$ between protrusions 64 and second side 84 are substantially similar in multi-layer substrate 70 and distances $k_r$ between recessions 66 and second side 84 are substantially similar in multi-layer substrate 70.

In one example, as illustrated in FIG. 6, second side 84 may be provided as a normalization surface by contacting conformal layer 80 with a planarizing mold 86 having a planar surface 88. Planarizing mold 86 may then be separated from conformal layer 80 and radiation impinged upon conformal layer 80 to polymerize and, therefore, to solidify the same. The radiation impinged on conformal layer 80 may be ultraviolet, thermal, electromagnetic, electrostatic, visible light, heat, and/or the like.

It should be noted that radiation impinged upon conformal layer 80 may be impinged prior to separation of planarizing mold 86 from conformal layer 80. Additionally, a low surface energy coating 90 may be deposited upon planarizing mold 86 to reduce adherence of conformal layer 80 to planarizing mold 86.

Alternatively, release properties of conformal layer 80 may be improved by including a surfactant. The surfactant may provide the desired release properties to reduce adherence of conformal layer 80 to the planarizing mold 86. For purposes of this invention, a surfactant may be defined as any molecule, one tail of which is hydrophobic. Surfactants may be either fluorine containing, e.g., include a fluorine chain, or may not include any fluorine in the surfactant molecule structure. An exemplary surfactant is available under the trade name ZONYL® FSO-100, manufactured by E.I. du Pont de Nemours and Company, with an office located in Wilmington, Del. ZONYL® FSO-100 has a general structure of $R_1R_2$, where $R_1 = F(CF_2CF_2)_Y$, with Y being in a range of approximately 1 to 7, inclusive and $R_2 = CH_2CH_2O(CH_2CH_2O)_XH$, with X being in a range of approximately 0 to 15, inclusive. It should be understood that the surfactant may be used in conjunction with, or in lieu of, low surface energy coating 90 that may be applied to the planarizing mold 86.

Referring to FIGS. 6 and 7, portions of conformal layer 80 may be removed to provide crown surface 92. For example, conformal layer 80 may be etched to expose crown surface 92. Alternatively, a chemical mechanical polishing/planarization process may be employed to remove portions of conformal layer 80 to provide crown surface 92. Crown surface 92 may be defined by an exposed surface 94 of each protrusion 64 and surface 96 of conformal layer 80 remaining after etching.

Referring to FIGS. 7 and 8, crown surface 92 may be subjected to an anisotropic plasma etch. The etch chemistry of the anisotropic etch may be selected to maximize etching of the exposed surface 94 of protrusions 64 and minimizing etching of surface 96 of conformal layer 80. For example, by employing an anisotropic plasma etch having oxygen-based chemistry, a hard mask 98 may be formed adjacent to surface 96 of conformal layer 80. Hard mask 98 may be the result of interaction of silicon-containing polymerizable material and oxygen plasma. As a result of hard mask 98 and anisotropy of the etch process, portions of conformal layer 80, resist layer 78, and adhesion layer 76 may be removed providing regions 99 in superimposition with etch mask layer 74.

Figure 9:
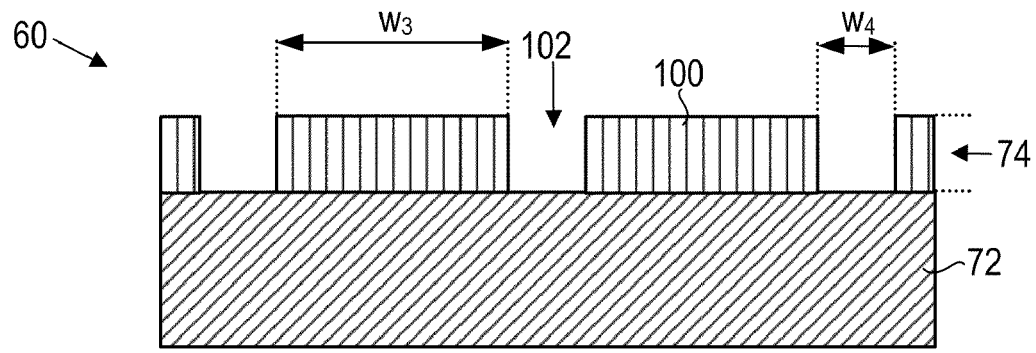

Referring to FIGS. 8 and 9, an etch may further be used to define protrusions 100 and recessions 102 forming a first patterned substrate 10. For example, an anisotropic fluorine plasma etch may further be used to define protrusions 100 and recessions 102 in etch mask layer 74 forming a sub-master template 60. Protrusions 100 in etch mask layer 74 may have a width $w_3$ and recessions 102 in etch mask layer 74 may have a width $w_4$. For example, width $w_3$ of protrusions 100 may have a magnitude of 60 nm and width $w_4$ may have a magnitude of 20 nm. Adhesion layer 76, resist layer 78, conformal layer 80, and hard mask 98 may be subsequently removed.

It should be noted that if conformal layer 80 is formed from a silicon-containing photo-responsive material, the removal of conformal layer 80 may be achieved in a manner consistent with the removal of silicon-containing photo-resist material. As a result, it may not be necessary to employ a blanket fluorine etch in the process above.

FIGS. 10-15 illustrate exemplary formation of sub-master template 60a from sub-master template 60 using pattern density doubling. Pattern density doubling of sub-template 60 may provide features 100 and/or 102 of sub-master template 60 to be altered to form sub-master template 60a. For example, the pattern provided by protrusions 100 and/or recessions 102 of sub-master template 60 may be further reduced and the number of protrusions 100 and/or recessions 102 increased to form the pattern on sub-master template 60a (e.g., half-pitch features).

Figure 10:
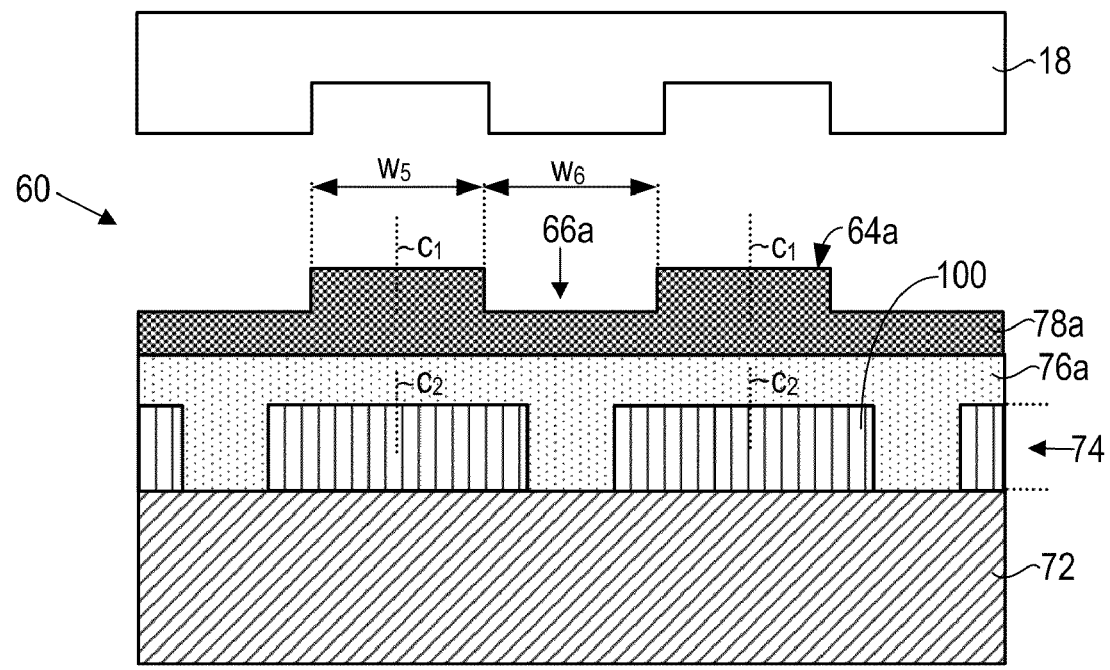
FIGS. 10-15 illustrate exemplary formation of sub-master template using pattern density doubling in one direction.

Referring to FIGS. 9 and 10, an adhesion layer 76a and a resist layer 78a may be positioned on sub-master template 60 such that etch mask layer 74 is positioned between substrate layer 72 and adhesion layer 76a and adhesion layer 76a is positioned between etch mask layer 74 and resist layer 78a. Adhesion layer 76a may be substantially similar to and have substantially similar composition to adhesion layer 76.

Resist layer 78a may be substantially similar to and/or have substantially the same composition to resist layer 78. To that end, resist layer 78a may have a plurality of protrusions 64a and recessions 66a. Protrusions 64a of resist layer 78a may have a width $w_5$ and recessions may have a width $w_6$. For example, protrusions 64a may have a width $w_5$ of approximately 40 nm and recessions 66a may have a width $w_6$ of approximately 40 nm. Width $w_5$ of protrusions 64a may be increased, reduced, and/or substantially similar to width $w_3$ of protrusion 100 and/or width $w_1$ of protrusion 64. In a similar fashion, width $w_6$ of recession 66a may be increased, reduced, and/or substantially similar to width $w_4$ of recession 102 and/or width $w_2$ of recession 66.

Protrusions 64a and recessions 66a of resist layer 78a may be formed using techniques, including, but not limited to, imprint lithography, e-beam lithography, photolithography (various wavelengths including 193 nm, 157 nm, and 13.2-13.4 nm), x-ray lithography, ion-beam lithography, and atomic beam lithography. For example, protrusions 64a and recessions 66a of resist layer 78a may be formed using master template 18 using imprint lithography.

Protrusions 64a may be positioned in superimposition with protrusions 100. For example, protrusion 64a may be positioned such that each center $C_1$ of each protrusion 64a is substantially aligned with center $C_2$ of protrusion 100.

Substantial placement error in the x direction and the theta θ during positioning of protrusions 64a to be in superimposition with protrusions 100 and substantially centered, may inhibit the formation of the density pattern (e.g., double density) of sub-master template 60a (shown in FIG. 15) as compared to master template 18 (shown in FIG. 4). A placement error having a magnitude greater than 10% in the x-direction may offset the pitch of the pattern leading to distortions. (e.g., 5 nm placement error using master template 18 having a 100 nm pitch estimated to provide sub-master template 60a with 50 nm pitch). In the theta θ direction, for a pattern length of 10 mm, a placement error greater than 0.1 μm over the 10 mm length may also lead to distortions. As such, protrusions 64a and protrusions 100 may be substantially aligned in the x direction and the theta θ direction prior to patterning. It should be noted that alignment in the y direction may also be incorporated. In some circumstances and depending on design considerations, however, alignment in the y direction may not be needed.

Exemplary alignment processes are further described in U.S. Patent Publication No. 2006/0019183 and U.S. Patent Publication No. 20070228610, both of which are hereby incorporated by reference. Moire pattern alignment may also be used to provide substantially centered protrusions 64a and 100. For example, moiré pattern alignment may be used to center recessions 24 of master template 18 with respect to protrusions 100 of sub-master template 60.

Additionally, to facilitate alignment, master template 18 and sub-master template 60 may comprise substantially the same material, such as, for example, fused silica. By using substantially similar materials, thermal properties of master template 18 and sub-master template 60 may be substantially similar.

Figure 11:
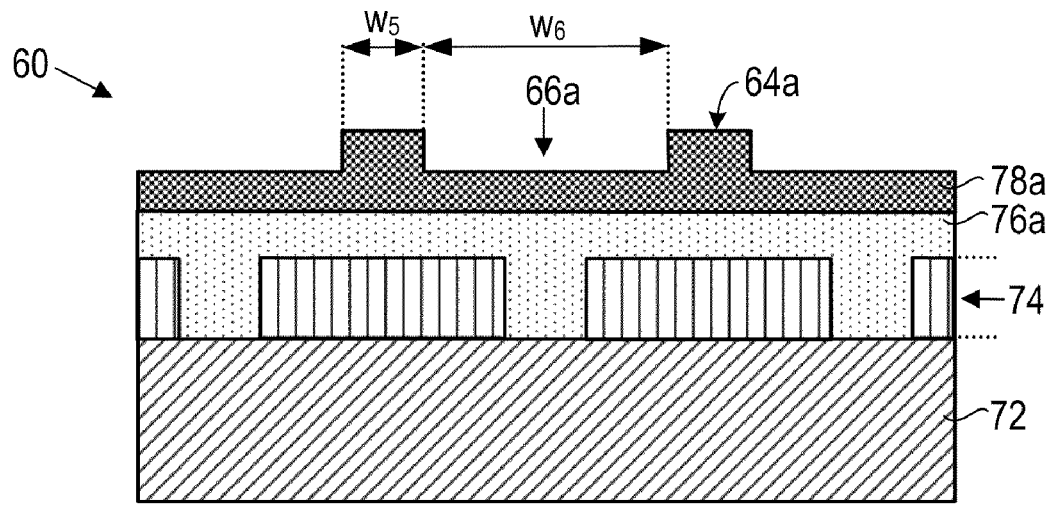

Referring to FIGS. 10 and 11, sub-master template 60 may be subjected to a trim etching process to alter width $w_5$ of protrusions 64a and width $w_6$ of recessions 66a. For example, the trim etching process may reduced width $w_5$ of protrusions 64a and increase width $w_6$ of recessions 66a. In one example, after a trim etching process, width $w_5$ of protrusions 64a may be reduced from 40 nm to 20 nm and width $w_6$ of recessions 66a may be increased from 40 nm to 60 nm. This trim etching process may be substantially similar to the trim etching process described above with respect to multi-layer substrate 70.

Referring to FIGS. 10-14, a reverse tone of protrusions 64a may be transferred into sub-master template 60. A conformal layer 80a may be deposited adjacent to protrusions 64a. Conformal layer 80a may be deposited using methods including, but not limited to, spin-on techniques, contact planarization, and the like. Conformal layer 80a may be substantially similar to and/or have substantially similar composition to conformal layer 80.

Conformal layer 80a may have a first side 82a adjacent to resist layer 78a and an opposing second side 84a distant to resist layer 78a. Second side 84a may provide a normalization surface. For example, the normalization surface may provide a substantially normalized profile. For example, the normalization surface may provided a substantially normalized profile by ensuring distances $k_{p2}$ between protrusions 64a and second side 84a are substantially similar in sub-master template 60 and distances $k_{r2}$ between recessions 66a and second side 84a are substantially similar in sub-master template 60. For example, conformal layer 80a may be contacted by a planarizing mold 86 having a planar surface 88 as described in detail and shown in FIG. 5.

Figure 12:
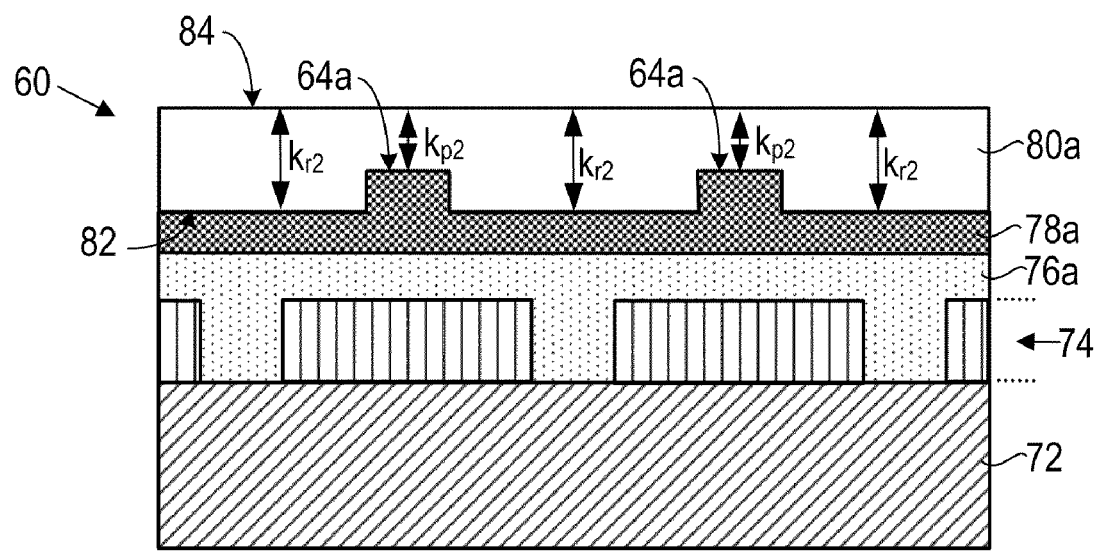
Figure 13:
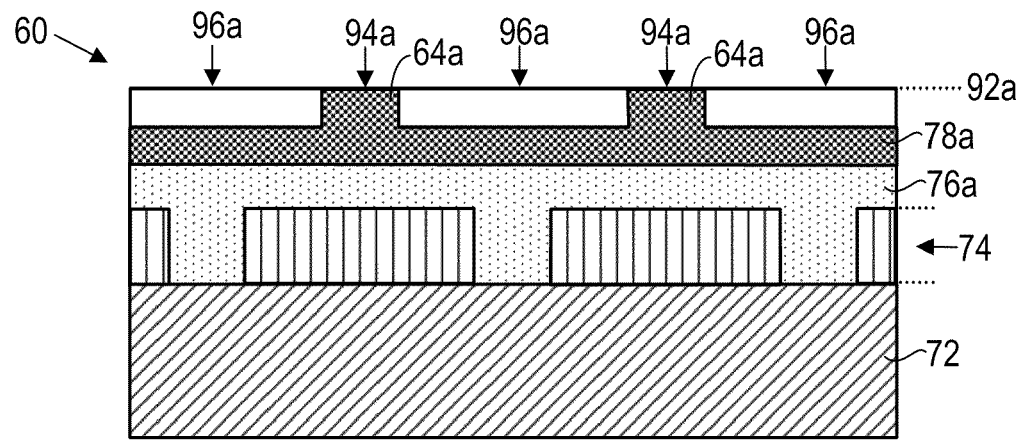

Referring to FIGS. 12 and 13, portions of conformal layer 80a may be removed to provide crown surface 92a. For example, conformal layer 80a may be etched to expose crown surface 92a. The techniques used to remove portions of conformal layer 80a may be substantially similar to the techniques used to remove portions of conformal layer 80 (e.g., blanket etch). Crown surface 92a may be defined by an exposed surface 94a of each protrusion 64a and surface 96a of conformal layer 80a that remains after etching.

Figure 14:
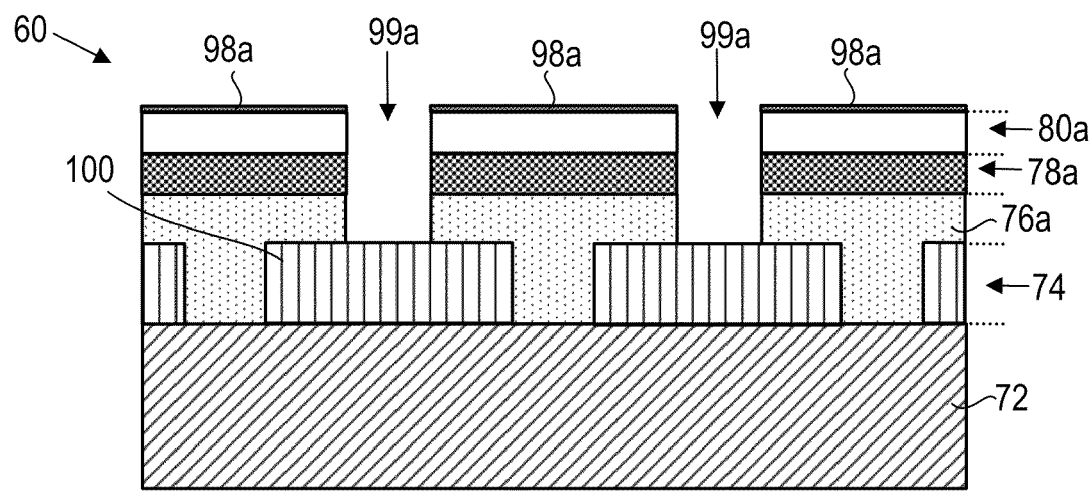

Referring to FIGS. 13 and 14, crown surface 92a may be subjected to an etch process to form a hard mask 98a and expose regions 99a in superimposition with protrusions 100. For example, crown surface 92a may be subjected to an anisotropic plasma etch. The etch chemistry of the anisotropic etch may be selected to maximize etching of the exposed surface 94a of protrusions 64a and minimizing etching of surface 96a of conformal layer 80a. For example, by employing an anisotropic plasma etch having oxygen-based chemistry, the hard mask 98a may be formed adjacent to surface 96 of conformal layer 80 by the interaction of silicon-containing polymerizable material and oxygen plasma. As a result of hard mask 98a and anisotropy of the etch process, regions 99a in superimpositions with protrusions 100 may be exposed.

Figure 15:
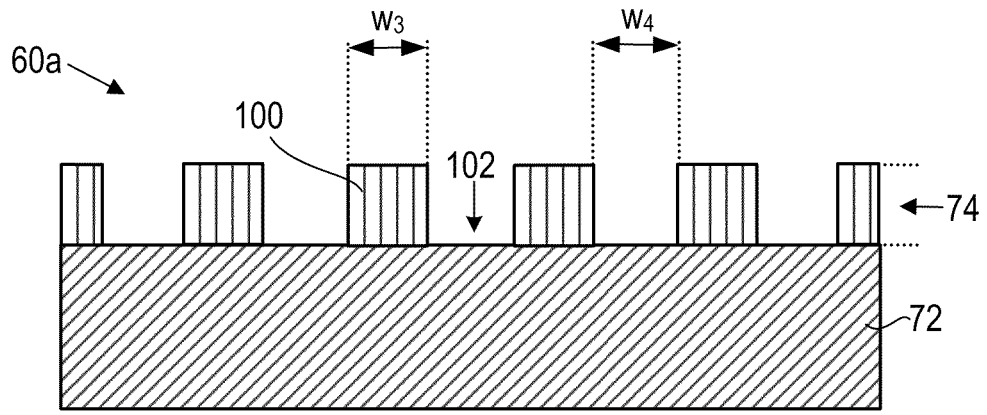

Referring to FIGS. 14 and 15, an etch process may be used to transfer the pattern provided by regions 99a to etch mask layer 74. For example, an anisotropic fluorine plasma etch may be employed to transfer the pattern provided by regions 99a to etch mask layer 74. As a result, width $w_3$ of protrusions 100 in etch mask layer 74 may be reduced forming sub-master template 60a such that the magnitude of width $w_3$ of protrusions 100 may be reduced in sub-master template 60a as compared to sub-master template 60. For example, width $w_3$ in sub-master template 60 may be 40 nm as compared to 20 nm in sub-master template 60a. Recessions 102 in etch mask layer 74 may remain substantially similar in sub-master template 60a as compared to sub-master template 60. After patterning protrusions 100 in etch mask layer 74, adhesion layer 76a, resist layer 78a, and conformal layer 80a may be subsequently removed.

Figure 16A:
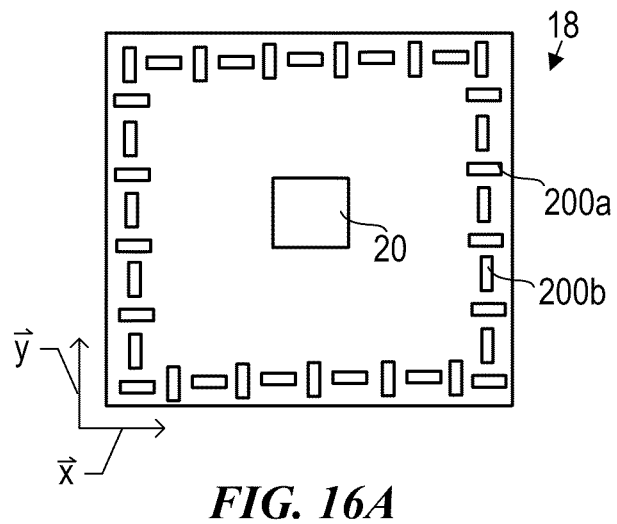
FIGS. 16A and 16B illustrate top down views of exemplary sub-master templates having moiré alignment marks positioned thereon.
Figure 16B:
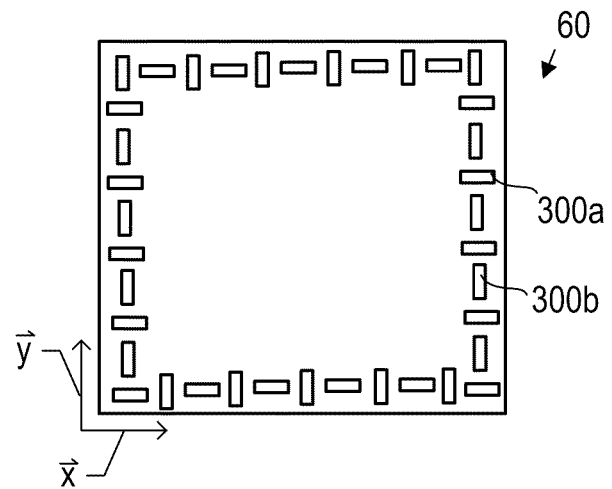

Referring to FIGS. 16A and 16B, and as described above, patterning of sub-master templates 60 and/or 60a by master template 18 may be facilitated by the use of alignment marks 200 and/or 300. Depending on design considerations, the pattern of alignment marks 200 of master template 18 may need to be transferred to sub-master templates 60 and/or 60a. In other circumstances, however, the pattern of alignment marks 200 of master template 18 may not need to be transferred to sub-master template 60 and/or 60a.

Figure 17:
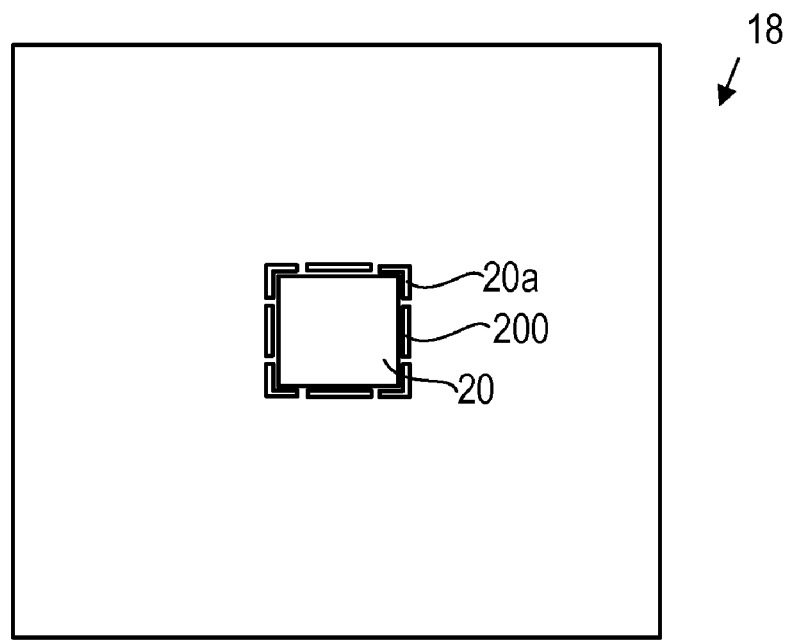
FIG. 17 illustrates a top down view of an exemplary sub-master template having a plurality of alignment marks and test patterns surrounding a mold.
Figure 18:
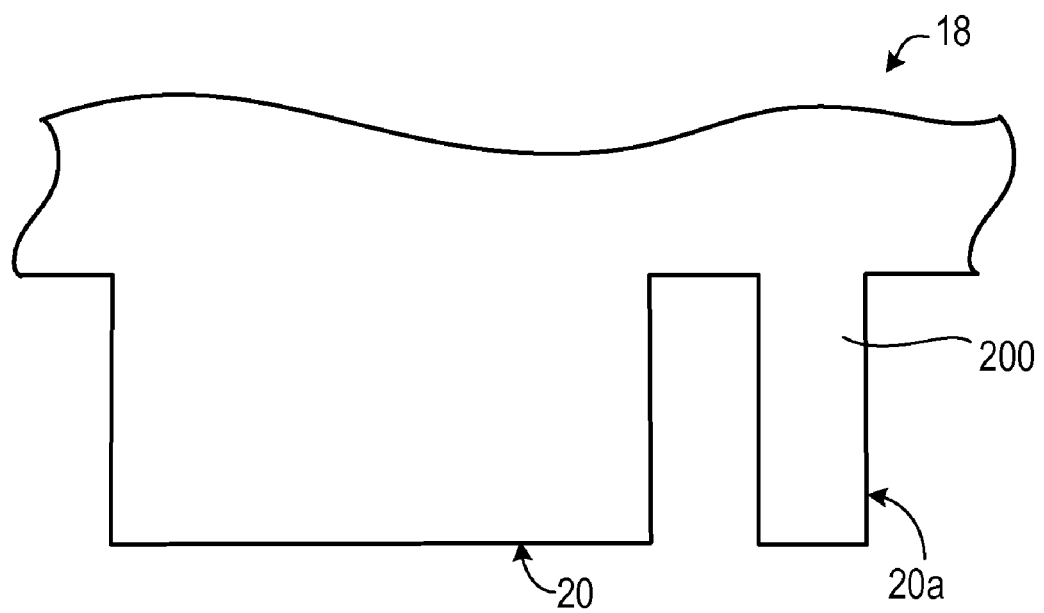
FIG. 18 illustrates a simplified side view of an exemplary sub-master template.

To prevent transfer of the pattern of alignment marks 200 of master template 18 to sub-master templates 60 and/or 60a, alignment marks 200 may be placed on a secondary mold 20a as illustrated in FIGS. 17 and 18. Secondary mold 20a may be spaced apart from mold 20. Further, secondary mold 20a may be designed such that there is limited or no contact of secondary mold 20a with polymerizable material 34. Without contact to polymerizable material 34, secondary mold 20a may minimize or prevent patterning of alignment marks 200. Additionally, alignment may be employed in combination with methods of fabricating sub-lithographic sized line and space patterns as described in U.S. Pat. No. 6,759,180, which is hereby incorporated by reference.

It should be noted that the number of alignment marks 200 and/or 300 may be increased to further facilitate alignment in the x direction and/or the theta Θ direction. Additionally, alignment marks 200 and/or 300 of master template 18, sub-master template 60, and/or sub-master template 60a, respectively, may be positioned at a distance from mold 20.

FIGS. 19 and 20 illustrate formation of sub-master template 60b from sub-master template 60a using pattern density doubling in two directions. Subsequent to forming sub-master template 60a along a first direction $D_1$ (e.g., pattern density doubling in one direction), sub-master template 60a may be patterned along a second direction $D_2$ using the techniques described herein to form sub-master template 60b having pillars 104. Pillars 104 may have a dimension $c_1$ along direction $D_1$ and a dimension $c_2$ along direction $D_2$.

Sub-master template 60b may be patterned employing the above-mentioned processes used to form sub-master templates 60 and/or 60a. During formation, sub-master template 60b and/or master template 18 may be rotated approximately 90 degrees with respect to the other.

To obtain the desired alignment between sub-master template 60b and master template 18 (e.g., along θ) alignment marks 200 on master template 18 and/or alignment marks 300 on sub-master template 60b may be used. For example, as illustrated in FIGS. 16A and 16B, when patterning along direction $D_1$, alignment mark 300a may be aligned with alignment mark 200a of master template 18 and alignment mark 300b may be aligned with alignment mark 200b of master template 18. When patterning along direction $D_2$, alignment mark 300a may be aligned with alignment mark 200b of master template 18 and alignment mark 300b may be aligned with alignment mark 200a of master template 18.

Substantial placement error in the theta θ direction during patterning in the second direction $D_2$ may result in distortions in sub-template 60b. It may be noted that placement error in the x direction and the y direction may be negligible. As such, patterning in the second direction $D_2$ may be considered a robust process.

It should be noted that a reverse tone of sub-template 60b may be employed as further described in U.S. Patent Publication No. 2004/0188381, which is hereby incorporated by reference herein. In using a reverse tone, sub-template 60b may be defined by a plurality of contact holes.

What is claimed is:

1. A method of patterning a multi-layered substrate, the method comprising:
    patterning, using a first template, the multi-layered substrate to provide at least one first protrusion and at least one first recession;
    depositing one or more additional layers on the multi-layered substrate, and,
    patterning, using the first template, the multi-layered substrate to remove portions of the first protrusions, the removal of portions of the first protrusions providing one or more additional protrusions;
    wherein removal of portions of the first protrusions creates a sub-master template having at least double pattern density as compared to the first template.

2. The method of claim 1, wherein patterning using the first template comprises:
    forming, by the first template, a first patterned layer on the multi-layered substrate, the first patterned layer having at least one second protrusion and at least one second recession;
    positioning, on the first patterned layer, a first conformal layer, the first conformal layer providing a first crown surface on at least a portion of the multi-layered substrate; and,
    selectively removing portions of the multi-layered substrate to expose regions of the multi-layered substrate in superimposition with the second protrusion while forming a first hard mask in areas of the first crown surface in superimposition with the second recession.

3. The method of claim 2, wherein forming the first patterned layer on the multi-layered substrate further comprises:
    disposing on the multi-layer substrate a polymerizable fluid composition;
    contacting, by the first template, the polymerizable fluid composition; and,
    subjecting the polymerizable fluid composition to conditions to polymerize the polymerizable fluid composition.

4. The method of claim 3, wherein the first template is an imprint lithography template.

5. The method of claim 1, wherein patterning the multi-layered substrate to remove portions of the first protrusion comprises:

forming, by the first template, a first patterned layer on the multi-layered substrate, the first patterned layer having at least one second protrusion in superimposition with the first protrusion;

positioning, on the first patterned layer, a first conformal layer, the first conformal layer providing a first crown surface on at least a portion of the multi-layered substrate; and, selectively removing portions of the multi-layered substrate to expose regions of the multi-layered substrate in superimposition with the second protrusion while forming a first hard mask in areas of the crown surface in superimposition with the second recession.

6. The method of claim 5, wherein forming the first patterned layer on the multi-layered substrate further comprises:

disposing on the multi-layer substrate a polymerizable fluid composition;

contacting, by the first template, the polymerizable fluid composition; and, subjecting the polymerizable fluid composition to conditions to polymerize the polymerizable fluid composition.

7. The method of claim 6, wherein the first template is an imprint lithography template.

8. The method of claim 5, wherein a width of the first protrusion is less than a width of the second protrusion.

9. The method of claim 5, wherein a center of the first protrusion is substantially aligned with a center of the second protrusion.

10. The method of claim 5, wherein the second protrusion and the second recession are trim etched prior to positioning the first conformal layer.

* * * * *